(12) United States Patent  
Greaves

(10) Patent No.: US 6,606,734 B2
(45) Date of Patent: Aug. 12, 2003

(54) SIMULATION METHOD AND COMPILER FOR HARDWARE/SOFTWARE PROGRAMMING

(76) Inventor: David J. Greaves, 10 Tenison Road, Cambridge CB1 2DW (GB)

(*) Notice: Subject to any disclaimer, the term of this patent is extended or adjusted under 35 U.S.C. 154(b) by 77 days.

(21) Appl. No.: 09/886,701

(22) Filed: Jun. 21, 2001

(65) Prior Publication Data

US 2003/0061580 A1 Mar. 27, 2003

(51) Int. Cl.[7] .............................................. G06F 17/50
(52) U.S. Cl. ........................................................ 716/4
(58) Field of Search .............................. 435/6; 716/4, 5, 716/12, 16, 17, 18; 717/160; 326/41

(56) References Cited

U.S. PATENT DOCUMENTS 6,097,212 A * 8/2000 Agrawal et al. ............. 326/41
6,188,975 B1 * 2/2001 Gay ............................. 703/22
6,415,420 B1 * 7/2002 Cheng et al. ................. 716/4
6,507,947 B1 * 1/2003 Schreiber et al. ........... 717/160

* cited by examiner

Primary Examiner—Matthew Smith
Assistant Examiner—Thuan Do
(74) Attorney, Agent, or Firm—TraskBritt

(57) ABSTRACT

A method for converting a hardware description language describing an integrated circuit or software operating thereon to an alternative programming language, such as ANSI C, C++, Java, or other object-oriented programming language, is described. The method provides for the single compilation operations as well as the ability to link multiple compilations to simulate large hardware description language designs. The method of the present invention improves the run time efficiency of the compiled code in a more user-friendly format.

16 Claims, 2 Drawing Sheets

SIMULATION METHOD AND COMPILER FOR HARDWARE/SOFTWARE PROGRAMMING

A portion of the disclosure of this patent document contains material which is subject to copyright protection. The copyright owner has no objection to the facsimile reproduction by any-one of the patent document or the patent disclosure, as it appears in the Patent and Trademark Office patent file or records, but otherwise reserves all copyright rights whatsoever.

REFERENCE TO COMPUTER PROGRAM LISTING APPENDIX

A computer program listing appendix is submitted on compact disc herewith. The material on and in the computer program listing appendix compact disc is hereby incorporated-by-reference. Two compact discs containing identical material, labeled "Copy 1" and "Copy 2," are included herewith as per 37 C.F.R. § 1.52. Copy 1 contains the following files (in Unix wc format) identified by the name of the file, the date of creation of the file to Copy 1, and the size of the file in kilobytes: ansichdr.sml, 8 KB, Jun. 19, 2001; ansicout.sml, 22 KB, Jun. 19, 2001; array$_{13}$ scalar$_{13}$ nonc.sml, 4 KB, Jun. 19, 2001; arrayscalar.sml, 11, KB, Jun. 19, 2001; blocknets.sml, 2 KB, Jun. 19, 2001; blockscan.sml, 13 KB, Jun. 19, 2001; builder.sml, 15 KB, Jun. 19, 2001; buzzels.sml, 2 KB, Jun. 19, 2001; cbgsmllib.sml, 16 KB, Jun. 19, 2001; check_condition.sml, 7 KB, Jun. 19, 2001; csim4.sml, 6 KB, Jun. 19, 2001; cv2.100.sml, 13 KB, Jun. 19, 2001; cv2core.sml, 60 KB, Jun. 19, 2001; cv2gens.sml, 37 KB, Jun. 19, 2001; cverrors.sml, 3 KB, Jun. 19, 2001; cvmetacmd.sml, 1 KB, Jun. 19, 2001; cvmlinit.sml, 2 KB, Jun. 19, 2001; cwords.sml, 2 KB, Jun. 19, 2001; cxverhdr.sml, 19 KB, Jun. 19, 2001; genpadring.sml, 3 KB, Jun. 19, 2001; mapping_report.sml, 1 KB, Jun. 19, 2001; maths.sml, 7 KB, Jun. 19, 2001; notinuse.sml, 25 KB, Jun. 19, 2001; pandex.sml, 27 KB, Jun. 19, 2001; rendervnl.sml, 26 KB, Jun. 19, 2001; sflatten.sml, 30 KB, Jun. 19, 2001; sfmapping.sml, 1 KB, Jun. 19, 2001; smlnj.sml, 7 KB, Jun. 19, 2001; smlnj_first.sml, 1 KB, Jun. 19, 2001; tableprinter.sml, 5 KB, Jun. 19, 2001; topsoaks.sml, 3 KB, Jun. 19, 2001; verinorm.sml, 114 KB, Jun. 19, 2001; veroptions.sml, 2 KB, Jun. 19, 2001; verxcheck.sml, 17 KB, Jun. 19, 2001; vnlaudit.sml, 2 KB, Jun. 19, 2001; vtoc.sml, 18 KB, Jun. 19, 2001; vtochrbody.sml, 77 KB, Jun. 19, 2001; vtoc_rexpr.sml, 16 KB, Jun. 19, 2001; vtoc_sort.sml, 20 KB, Jun. 19, 2001; vtoc_syscexpr.sml, 3 KB, Jun. 19, 2001; vtoc_widees.sml, 102 KB, Jun. 19, 2001; vtocnative.c, 4 KB, Jun. 19, 2001; and vtocnative.sml, 2 KB, Jun. 19, 2001. Copy 2 is an identical copy of Copy 1.

BACKGROUND OF THE INVENTION

1. Field of the Invention

The present invention generally relates to the conversion of a hardware description computer language to an alternative programming language. More particularly, the present invention relates to a compiler for converting or translating a hardware description computer language to ANSI C or an object-oriented programming language.

2. State of the Art

Hardware description languages are used to define and simulate the operation of integrated circuit chips. One such hardware description language is Verilog. Verilog is used by hardware designers in industry and academia. It allows a hardware designer to describe hardware designs at a high level of abstraction such as at the architectural or behavioral level as well as the lower implementation levels (i.e., gate and switch levels) leading to integrated circuit chip layouts and chip fabrication. The Verilog language also provides access to computer-aided design tools to aid in the design process at the different design levels. Verilog allows hardware designers to express their design with behavioral constructs, deferring the details of implementation to a later stage of design. An abstract representation helps the designer explore architectural alternatives for integrated circuit chips through simulations and to detect design bottlenecks before detailed design begins. A primary use of the simulations allows the designer to test designs before committing to their fabrication. For example, in the general field of integrated circuit chip design, it is useful for a company that has separate hardware and software teams to have available a program to simulate the behavior of the integrated circuits, and to simulate software executing on the integrated circuits. In addition, the use of hardware description languages allows companies that wish to pass executable models of integrated circuits to customers, to do so.

The Verilog language, and other hardware description languages, have a number of disadvantages. Verilog does not support multi-dimensional arrays, pointers or recursions. In addition, it is much slower than a semantically similar language such as ANSI C. One major reason for the slow computation time of a conventional Verilog simulation is the variable size. Many popular processors support variables of size 1, 8, 16, 32 and 64 bits in their instruction sets and this is reflected directly in common software programming languages, such as C. However, Verilog supports a continuum of variable sizes with some exceeding 1000 bits. Since most computational platforms only support 32 bits, the large variable sizes result in the longer run times. Therefore, it would advantageous to translate Verilog to an object-oriented programming language such as C where the variable size could be optimized to a variable or 1, 8, 16, 32, or 64 bits.

Typically, a compiler is required to translate a high-level language to another high-level language. Compilers are special programs that translate a high-level language into the internal language of a particular computer. Hence it is possible to use the same high-level language program on different platforms by using a separate compiler for each platform. It would be advantageous to translate a hardware description language to ANSI C, C++, JAVA or other object-oriented programming languages. The resulting program could then be compiled by an off the shelf compiler such as GNU C or Visual C to the internal language of the computer.

Hardware description language compilers are also expensive and less readily available than C compilers or object-oriented programming language compilers. Therefore, it is desirable to provide a compiler that converts hardware description languages to ANSI C or object-oriented programming languages to optimize run times, while at the same time allowing more individuals access to the ability to simulate hardware designs.

SUMMARY OF THE INVENTION

In general, the present invention is a method for converting computer programs written in hardware description languages, such as Verilog or VHDL, to alternative programming languages, such as C, C++, Java, or other object-oriented programming languages. The conversion of a hardware description language to an alternative programming language is accomplished using a compiler that performs the method of the present invention. Unlike conventional simulations using hardware description languages, simulations using the code generated by the present invention achieve optimizations at run time that reduce the required execution time while providing a user additional control over the simulation.

In one embodiment of the present invention a hardware description language computer program is converted to an alternative programming language. The conversion method involves a series of steps that convert a section of hardware description language into an executable program. Initially, a section of hardware description language is preprocessed to prepare the hardware description language section for conversion to an alternative programming language. Following preprocessing, the hardware description language section is flattened into a single, simplified, module using a simplified flattening process. The flattened code is then compiled into an unordered list of assignments using behavioral elaboration. The unordered list of assignments is sorted to order the assignments within clock groups and dependencies. Unused assignments, or assignments which the user chooses to ignore, are trimmed from the sorted assignments. The remaining sorted assignments are assigned to variables compatible with the alternative programming language. Expressions on the right-hand side of each assignment statement are converted to use the set of operators found in the target language. These expressions may not be quite the same as those in the hardware description language. Once processed in this way, the expressions are directly converted to the alternative programming language. The alternative programming language resulting from this method may be executed to simulate the integrated circuit chip described by the hardware description language section or to simulate software operating on the integrated circuit chip.

The simplified flattening process of the present invention may include calls to a stoplist, a leaveout list, or a mapto list. The stoplist identifies hardware description language modules that are not to be flattened. Instead, programming code, written in an alternative programming language, is associated with the files on the stoplist. The programming code may be identified in a linking file. This programming code is then substituted in the flattened module in place of the identified stoplist module. Similarly, the leaveout list defines those hardware description language modules that are not to be flattened, but rather disregarded, by the method of the present invention. The mapto list is similar to the stoplist, except the mapto list allows a user to define preprogrammed code to be substituted for hardware description language functions or tasks. Thus, certain hardware description language functions or tasks identified in the mapto list are replaced during the flattening step with preprogrammed code.

In an alternate embodiment of the present invention, multiple compilations created using the method of the present invention are linked together to model or simulate a large hardware description language program. For example, a large hardware description language program consisting of multiple modules may be divided into subsets of modules. Each module subset may be compiled to produce code of an alternative programming language that models the module subset. The compilations of the module subsets may be linked, providing an efficient method to create a simulation for a large hardware description language program.

The methods of the present invention convert a hardware description language computer program to an alternative programming language such as C, C++, Java, or other object-oriented language to simulate an integrated circuit chip or software operating thereon. In doing so, the run time efficiency of the simulation is improved.

DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

In general, the present invention is a method for converting computer programs written in hardware description languages, such as Verilog or VHDL, to other programming languages, such as C, C++, Java, or other object-oriented programming languages. For the purposes of this invention, any reference to alternative programming languages includes C, C++, Java and other object-oriented programming languages. The conversion of a hardware description language to an alternative programming language is accomplished using a compiler that performs the method of the present invention. Unlike conventional simulations using hardware description languages, simulations using the code generated by the present invention achieve optimizations at run time that reduce the required execution time while providing a user additional control over the simulation.

The optimizations of the present invention are realized in part by the unique modeling used by the present invention and by the conversion of the hardware description language into an alternative programming language that is easily converted into machine code, allowing operation without a programming language interpreter. Used together, the unique modeling and machine code operation allow an operational increase of between about 50 and 150 fold in terms of the number of events per second that may be processed for any given simulation.

The method of the present invention involves the conversion of at least one section of a hardware description language to an alternative programming language using a compiler, such as that which carries out the method of the present invention. For the purposes of this invention, a "section" of a hardware description language refers to a collection of hardware description language modules, tasks, and functions compiled during a single run of a compiler. Thus, a section of hardware description language may be a single module or a set of modules, including tasks and functions. For example, a hardware description language code set defining the operation of an integrated circuit chip may include a root module, or top-level module, containing instances of other modules. Compilation of the top-level module along with the instances of other modules constitutes the compilation of a section of hardware description language, the section being all of the modules, tasks, and functions that are compiled in one compilation instance.

Figure 1:
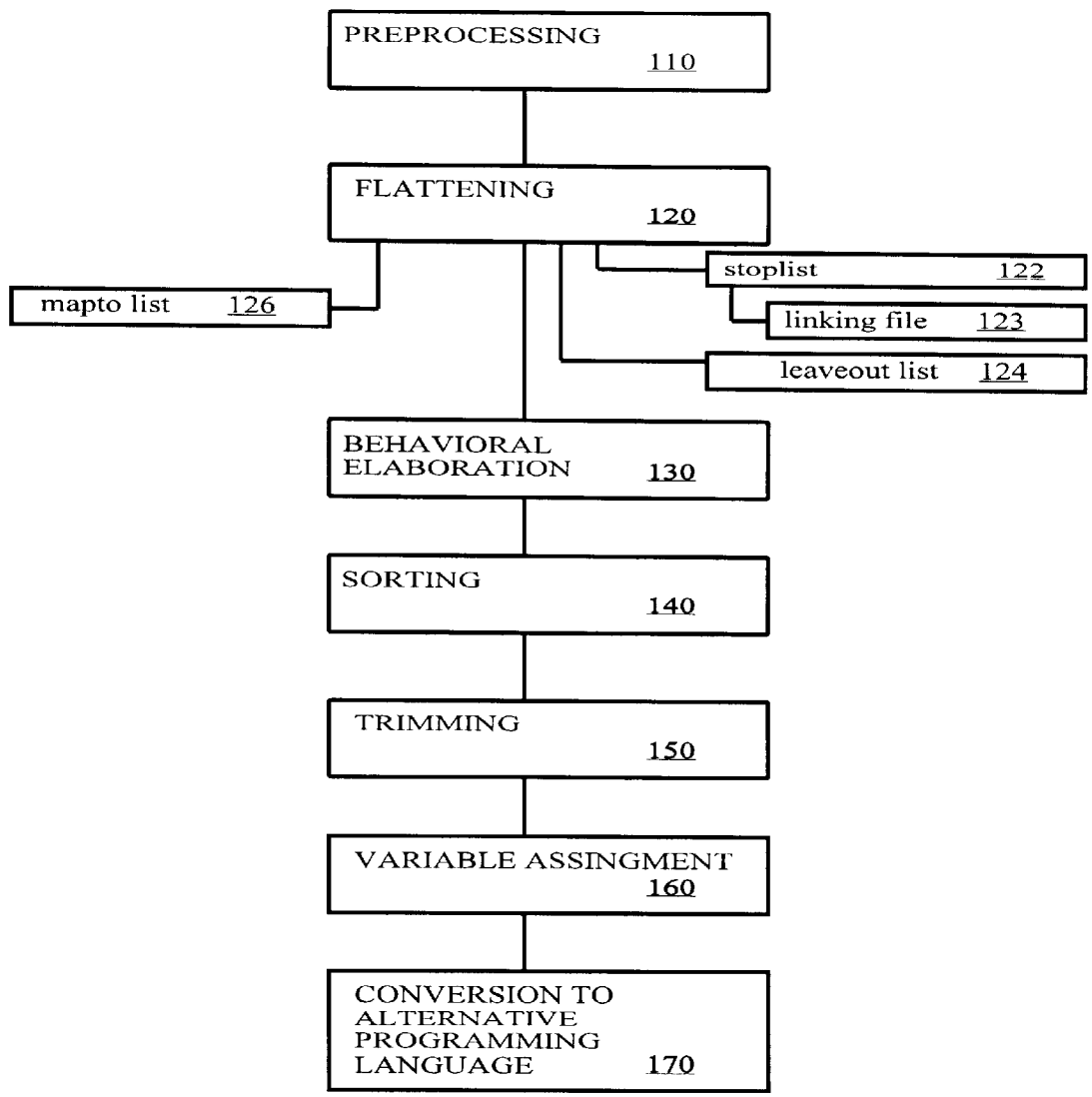
FIG. 1 illustrates a block diagram of a method of the present invention.

More particularly, one embodiment of the method of the present invention involves a series of steps to convert a section of hardware description language into an executable program. The steps involved are illustrated in block format in FIG. 1. Initially, a section of hardware description language is preprocessed 110 to prepare the hardware description language section for conversion to an alternative programming language. Following preprocessing 110, the hardware description language section is flattened 120 into a single, simplified, module. Flattening is a well-known process. However, the present invention uses a modified flattening process that introduces some simplification over typical flattening processes. Through behavioral elaboration 130, the flattened code is compiled into an unordered list of assignments. The unordered list of assignments is sorted 140 to order the assignments within clock groups and dependencies. Unused assignments, or assignments which the user chooses to ignore, are trimmed 150 from the sorted assignments. The remaining sorted assignments are assigned to variables 160 compatible with the target programming language. Expressions on the right-hand side of each assignment statement are converted to use the set of operators found in the target language. These expressions may not be quite the same as those in the hardware description language. When converting to C or C++, the only major difference in the set of operators available, and hence in the right-hand side expressions, occurs when expressions wider than the target supported width are used and such an expression carries between one target variable and the next, as produced in shifts and arithmetic. Once processed in this way, the expressions are directly converted to the target alternative programming language 170. The alternative programming language resulting from this method may be executed to simulate the integrated circuit chip described by the hardware description language section.

Typically, the method of the present invention is carried out by a compiler, or computer program, programmed to perform the steps of the method. In addition, the compiler may be capable of accepting user-defined constraints within which to execute the method of the present invention. Such constraints, and the processes of passing the constraints to the compiler, are described in further detail herein. In addition, each of the steps involved in this embodiment of the present invention are further described hereinafter.

Preprocessing 110 of a hardware description language section involves a number of sub-steps. First, the hardware description language section is read, or loaded, by the compiler. The preprocessing 110 step checks to make sure that all of the expected hardware description language modules are contained within the hardware description language section. If an expected module, task, or function is missing from the hardware description language section, the compiler may inform the user, or prompt the user to enter a path where the expected module may be located. Preprocessing 110 also involves the parsing of the hardware description language section to facilitate the conversion of hardware description language identities into equivalent statements using a restricted subset of the language. Conversion uses semantic identities that form part of the hardware description language's definition. For instance, an 'always' identity in Verilog (a hardware description language) may be converted into an 'initial while (1)' identity. Similarly, a Verilog 'for' statement may be converted into its equivalent 'while' form during preprocessing 110. Preprocessing 110 also checks for multiply defined identifiers in the hardware description language section. Essentially, preprocessing 110 converts the hardware description language to a smaller dialect of the hardware description language, thereby facilitating further processing.

In some instances, preprocessing 110 may read or load link files generated from previous runs of the compiler. The link files facilitate and allow a modular or incremental approach to be used to compile a large hardware description language simulation program. For example, an integrated circuit chip design for a integrated circuit chip having more that one hundred thousand gates may be represented by many hardware description language modules. The voluminous number of modules may be broken down into separate hardware description language sections so that each hardware description language section may be compiled individually. Based upon the compilation of the individual hardware description language sections, a link file may be created to share the results from the individually compiled hardware description language sections.

Following preprocessing 110, the hardware description language section is flattened 120 to create a single module from the modules, tasks, and functions that constitute the hardware description language section. Flattening 120 may occur on a single module, in which case it would have no effect, or on a hierarchy of modules where a root-module also contains several instances of sub-modules that are called by the root-module. During flattening 120, multiple instances of sub-modules may be removed and concatenated to form the flattened module. Variables assigned during flattening 120 may be renamed, locally or globally, to prevent clashes caused by identical variable names. In addition to traditional flattening 120, the method of the present invention includes some advantageous process steps that were heretofore unavailable in the art.

Certain modules, tasks, and functions used by hardware description languages are not readily convertible to object-oriented programming languages. This makes the flattening 120 of a hardware description language section difficult. For instance, 'specify' blocks used in Verilog to describe complex primitives, such as flip-flops, are not readily convertible to equivalent object-oriented programming language functions. Therefore, separate modules must be written by a user to simulate such primitives found in the particular hardware description language. The method of the present invention allows a user to identify those hardware description language modules in the section that may not be easily converted and substitute user written modules in their place. This is accomplished with the help of a stoplist 122. A stoplist 122 identifies the names of certain hardware description language modules that a user wishes to withhold from compilation. The stoplist 122 also identifies a linking file 123 associated with the undesired hardware description language module. The linking file 123 is typically the output of a previous compilation. The linking file 123 contains the information needed to determine the nature and frequency of calls to the previously generated object-oriented programming language code and it also describes the input/output ports and the combinatorial logic paths between the various input/output ports. The linking file 123 also indicates the mode of processing used for the clock variables for the previous compilation. For example, a hardware description language module on the stoplist 122 may have been previously compiled using the present method. The linking file 123 identifies and summarizes the alternative programming language code created during the previous compilation. During flattening 120, the object-oriented programming language code generated in the previous compilation, identified by the linking file 123, is called in place of the undesired hardware description language module identified in the stoplist 122.

Another advantage offered by the method of the present invention is the ability of a user to define certain hardware description language modules in the section to ignore during flattening 120. This provides a user the ability to decrease the size of the simulation system if the user is not interested in certain parts of the system defined by the hardware description language section. The undesired portions of the hardware description language section are defined by a leaveout list 124. A user may identify a leaveout list 124 in the compile command. Instances of the hardware description language modules identified in the leaveout list 124 are ignored and excluded during flattening 120. The output variables that are associated with the leaveout list 124 modules are left uncertain in the system.

Furthermore, the method of the present invention also removes the instances of output port variables that are not needed in the system. For example, a hidden output port variable is present in conventional Verilog to simulate the effect of a master-slave D-type flip-flop found in hardware. The user's variable connected to an output port is a master and the hidden variable is the slave. The purpose of these output port variables is identical to the motivation for having a master and a slave section in a D-type flip-flop, namely, to enable input information to be collected at all points in the system before any outputs are changed to reflect the next state of the system. During flattening 120, the unneeded output port variables are determined and removed from the resulting flattened module. In the present invention, all output port variables can be removed (except for those concerned with multiple-always blocks inside one module), because the full master-slave mechanism is re-introduced only, and exactly, where needed during the sort process. Because the unnecessary output port variables are removed, the flattened module may be compiled more efficiently.

The method of the present invention also allows a user to specify a mapto list 126 of hardware description language tasks and functions that should not be converted to the alternative programming language. Instead, user defined programming language code is substituted for the identified tasks and functions. At times, a user may have already converted a hardware description language task or function to an alternative programming language code. For instance, users commonly have access to a library of standard tasks and functions written in an object-oriented programming language. If object-oriented programming language code has already been written to emulate a hardware description language task or function, it is advantageous to substitute that object-oriented programming language code for the task or function rather than recompiling the hardware description language. During flattening 120, the method of the present invention retrieves the mapto list 126 and substitutes a call to the user's programming language code in the flattened module.

The mapto 126 call may be embedded in a comment next to a hardware description language task or function definition. This causes the body of the function or task to be largely ignored and an alternative programming language subroutine to be called whose name is given in the mapto 126 directive. The routine must be provided by the user and is typically for some unction that is called frequently and must be implemented by hand for performance, such as a Galois multiply. The body is not entirely ignored by flattening 120 since it is scanned for free variable references that are considered during the relevant variable sort to make sure that these have their correct values at the time the equivalent programming language subroutine is called.

Behavioral elaboration 130 operates on the flattened module to create an unordered list of assignments. Behavioral elaboration 130 performs symbolic evaluation to mirror what a thread of execution would evaluate in a simulator. This results in the creation of a Register Transfer Level (RTL) assignment for each variable. The order of the RTL assignments is insignificant because the assignments occur in parallel. Blocking assignments, whose order is generally significant, are converted into non-blocking assignments, whose order is not significant. The output from the behavioral elaboration 130 is a set of pairs where each pair consists of an unordered list of assignments that must happen in parallel along with a description of the events that cause the assignments to be made. Each list of assignments corresponds to a set of transfers that should occur on an active clock edge. However, behavioral elaboration 130 ignores the timing specifications of the hardware description language, resulting in cycle-based simulation as opposed to an event-based simulation.

For instance, behavioral elaboration 130 performs symbolic evaluations to mirror what a thread of execution would actually evaluate in a simulator. The result is a set of RTL assignments, one per assigned variable. Unlike the behavioral input code, RTL has the property that the order of the transfer statements is not significant since they are all to occur in parallel on one active clock edge. This is demonstrated by Table I, which discloses Verilog code (a hardware description language) on the left, RTL in the middle, and a C code conversion on the right. In this example, the assignment to v has been subject to a further reordering, according to dependency sorting rules for sorting 140, explained herein.

TABLE I

| Verilog code | RTL code | C code |
| --- | --- | --- |
| always | | |
| @(posedge clk) | | |
| begin | | { |
| a = b & c; | a <= b & c | a = b & c; |
| v <= a; | d <= v \| c | d = v \| c; |
| d = v \| c; | v <= b & c | v = b & c; |
| end | | } |

In another example, shown in Table II, an intermediate variable is used in a swap to act as a flip-flop master for a C compiled code. The name for the intermediate variable is automatically generated by the compiler by appending '_t'.

TABLE II

| Verilog code | C code |
| --- | --- |
| Always @ (posedge clk) | { |
| a <= b; | a_t = b; |
| b <= a; | b = a; |
| end | a = a_t; |
| | } |

When arrays are used, subscripts are often expressions that vary and can thus introduce ordering constraints for the assignments in an object-oriented programming language code. Since the equality of subscripts cannot always be checked at compile time the compiler must make a safe assumption using auxiliary variables to hold subscripts and master variable to hold the new contents, thus making the assignments occur from the masters to slaves. Also, some assignments to arrays are conditional, so instead of assigning the old value where the condition for the assignment is false, which would require a read and then a write of the same location with the same value, the assignment is enclosed in an 'if' statement.

Some of the assignments created by behavioral elaboration 130 are dependent upon other assignments and events in the unordered list of assignments. Evaluation of such assignments leads to a condition known as event chase that also occurs within hardware. Event chase is a general name for events at one point causing events at another point. In hardware, event chasing is implemented in parallel by all of the gates and quickly settles down, but nonetheless, the system clock speed must be set sufficiently slow to ensure that settling occurs before the next active clock edge. A simple Verilog simulator operates in a serial fashion and must revisit each variable associated with an event chase repeatedly until the event chase terminates, resulting in a slow process. Using the method of the present invention, event chase is resolved as quickly as possible owing to the sorting procedures used, thus resulting in a more optimal simulation.

Output from behavioral elaboration 130 corresponds to logic gates operating in parallel in most hardware description languages. Unlike a hardware description language simulation, programming languages such as C, and C++, and Java execute in serial rather than parallel mode. Therefore, the assignments from the behavioral elaboration 130 must be reordered to achieve the same overall effect of a hardware description language simulation. The parallelism of the hardware description language is modeled by sorting 140 the assignments created by behavioral elaboration 130 such that a serial execution of the alternative programming language mimics the hardware description language simulation.

Sorting 140 arranges the assignments generated by behavioral elaboration 130 into an order that mimics the overall effect of the parallel actions that occur in hardware description languages. This is necessary because alternative programming languages typically operate with serial thread execution. However, some assignments from behavioral elaboration 130 are not readily sorted into a serial order. Therefore, intermediate variables are created during sorting 140 to model the parallelism of the hardware description languages.

Many of the parallelism problems are eliminated by the sorting 140 method used with the present invention. Sorting 140 occurs using a modified bubble sort algorithm. The bubble sort allows the assignments that do not affect other assignments to float to the top of the ordered list where they will be executed first by the alternative programming language. Initially, the assignments are classified and grouped as either combinatorial assignments or sequential assignments. This classification is an intrinsic property of the variable. Combinatorial variable always update themselves if anything that they depend on changes. Combinatorial assignments include those assignments that are needed before other assignments. For instance, a variable A has an initial value A1. By assignment, variable A is assigned to a new value A2. However, variable B is assigned a value dependent upon the current value of A. Because B is dependent upon A, the variable A is a combinatorial variable and the assignment of A to a value of A2 is a combinatorial assignment. Sequential variables, on the other hand, change only when a clock changes or when a member of an associated sensitivity list changes. A sensitivity list defines those sequential variables that must also be changed upon the changing of a defined variable. A sequential assignment has no effect on any later assignments. In other words, if variable C is assigned a value, that assignment does not affect any other assignments in the set of assignments.

Following classification, the assignments are sorted 140 by the bubble sort. If the sorting algorithm is unable to produce an order for a particular assignment due to the parallel nature of the assignment, sorting 140 breaks the parallel nature by introducing an intermediate variable. The introduction of an intermediate variable depends upon the type of assignment. For a sequential assignment set, an additional variable known as the master variable is introduced. The required assignment is made to the master variable. The original variable assignment is then placed at the end of the sorted list and is referred to as the slave variable. It is assigned from the master copy, as in a master-slave D-type flip-flop. In this manner, conventional edge-triggered logic is modeled, but with the advantageous property that the master variable is only present where strictly needed.

Unbreakable parallel combinatorial assignments are handled in a different fashion. Typically, a loop represented by an incorrect sorted order in a set of combinatorial assignments represents an error in the design logic. Therefore, the compiler of the present invention generates a warning for the user alerting them to the possible existence of the design error. If the assignment associated with the incorrect sorted order only occurs in one loop, the assignments may be replicated such that a linear traversal of the overall list of assignments causes any event to have been propagated at least once around the whole loop, regardless of where it started. The sorting 140 thereby generates an arbitrary ordering for the combinatorial assignment. For example, if the loop were to the variables A, B, C, D, A, where each variable depends on the one after it, then the following sequence may be generated: A, B, C, D, A, B, C, D. In this manner, all of the possible effects before and after step A are captured in a single execution. The final sorted list for the combinatorial assignments is reversed by the sort method 140. The reversal of the combinatorial assignments is necessary because the final values on the inputs of the assignments depend upon the final outputs of the assignments.

At the sorting 140 stage, edge detectors for the simulation are also generated. For each assignment occurring on an event condition, the compiler generates an additional variable for each assignment known as the historic copy. After all other assignments have occurred, the values of the assignments are copied into their respective historic copies. The copying process is implemented by a set of assignment statements attached to the end of the sorted assignments. This allows the previous value of the assignment to be stored for the next execution of the object-oriented programming language. Additionally, in order to evaluate an edge sensitivity condition, such as the positive edge of a clock, the current value of the assignment is anded with the negative of the historic copy and used as a guard condition for 'if' statements containing the assignments.

Furthermore, sorting 140 filters the combinatorial assignments and places only those that are actually needed in the appropriate places within the sorted assignment order. The needed combinatorial assignments must be executed before and after each set of sequential assignments. Therefore, the combinatorial assignments needed to generate support for the sequential assignments are placed before the sequential assignments and those combinatorial assignments that update signals that depend on the sequential assignments are also placed after the sequential assignments.

In an alternative embodiment of the present invention, sorting 140 creates an object-oriented programming language class having two methods, a slave method and a step method. Of course, to use this embodiment of the present invention, the object-oriented programming language to which the hardware description language is being compiled must support class and method structures. For example, C++ may be used, but not C, as the target language according to the alternate embodiment of the present invention.

The step method of the alternate embodiment contains all of the assignments previously described with respect to the present invention. In addition, the step method includes a replica set of variables for all of the output assignments of the section. The step method uses the replica variables for internal use, operating on the replica set rather than the actual set of output assignments. Thus, the step method does not change any output assignments. The slave method, on the other hand, does change the output assignments. The slave method, however, does not change the internal assignments of the method. Instead, the slave method monitors the changes in the internal assignments of the simulated integrated circuit chip, as well as any combinatorial inputs to the simulated chip, and updates the simulated integrated circuit chip output assignments to reflect the most recent changes in the simulation. Thus, all of the combinatorial paths through a hardware description language section are bundled into the slave method that updates all of the outputs at once.

Following sorting 140, in any embodiment of the present invention, is a trimming 150 step. During trimming 150, the compiler analyzes the output assignments of the simulation. If an output assignment is not used, or an assignment corresponding to unused wires or registers defined by the hardware description language is not used, the trimming 150 eliminates that assignment from the code to be compiled. Trimming 150 results in a more efficient evaluation at runtime because excess assignments are trimmed during the compilation. In addition, a user may also be given the opportunity to control trimming 150 at compile time. Using command lines, a user may instruct the compiler to include those assignments that would have otherwise been excluded by trimming 150, since the user may like to see their values at runtime for debugging or other purposes, or instruct the compiler to trim assignments that would not have been excluded by trimming 150, for efficiency or other reasons.

Before beginning the conversion of the assignments to an alternative programming language 170, the assignments are converted to variables that the alternative programming language can operate on. In the present invention, this results in the optimization of the compilation process because the size of the variables is more precisely defined over the hardware description language definitions, thereby saving memory space in the computer or system running the present invention.

Variable assignment 160 involves the conversion of the hardware description language variables and expressions into alternative programming language variables and expressions. Although the arithmetic and logic expressions in hardware description languages are very similar to those in most alternative programming languages, the size of the variables differs in the languages. For example, C and C++ programming language implementations support variable sizes of 1, 8, 16, 32, and 64 bits. Hardware description languages, on the other hand, typically support a continuum of variable sizes with variables more than 1000 bits width being used on occasion. In order to represent such variables in the C or C++ programming language, the hardware description language variables must be converted to C or C++ variables. Many times, other compilers fix the hardware description language variable size to a 64 bit variable. The variable assignment 160 of the present invention, however, optimizes the variable storage sizes to increase simulation performance. Preferably, the smallest object-oriented programming language variable size possible is used to store each hardware description language variable. In this manner, the overall memory requirement may be reduced, further decreasing the run-time for the system. For instance, if the nominal width of a hardware description language variable is 12 bits, a 16 bit C variable may be used to hold the hardware description language variable. Because a 16 bit variable size is used rather than a 64 bit variable size, less memory is required and the execution speed is increased at runtime. It may be advantageous to directly represent Verilog variables of 1, 8, 16, 32 and 64 bits using the underlying equivalent variables supported by the alternative programming language. Moreover, it would be advantageous to use the next largest variable or smallest combination of machine-level variables to hold a given Verilog variable for two reasons. The first reason is that this saves space and improves cache and memory system efficiency. The second reason is that if a value is calculated that is larger than should be stored in the Verilog variable, as may happen during execution of a Verilog program, the machine-level variable is composed to be exactly the correct width. Thus, the excess bits in the calculated value may be trimmed without additional masking processing.

During the conversion to an alternative programming language 170, the compiler of the present invention determines the possible range of values for each variable that may be generated at run time using a conventional, conservative analysis at compile time. According to the analysis, the variable size is set to the next highest variable size available in the alternative programming language. The analysis shows whether a value larger than should be stored in a variable can be calculated at run time under any possible circumstance. If so, then a mask is generated to remove the excess bits, but most frequently, the analysis will show that no such mask is needed, hence facilitating a faster execution at run time.

Conversion to an alternative programming language 170 involves the execution of assignments in turn by a single alternative programming language thread. An output file is generated with each compilation, along with a header file and a report file. Typically, the output file contains a single routine. Within the routine, clocked assignments are enclosed inside 'if' statement so that they are only executed when a clock edge is being simulated, as defined by an operational mode designated in a command line. The components created by they conversion to an alternative programming language 170 include definitions of variables, assignments to variables representing combinatorial nets, assignments to master intermediate variables or directly to slave variables, assignments from master variables to slave variables, assignments to combinatorial outputs, proceeded by assignments to intermediate nets which feed into combinatorial outputs, and assignments from nets to their historic variables for nets which are used in edge detectors.

Initiation of the method of the present invention occurs using command lines to invoke the compiler and define the hardware description language section to operate on. Operational commands may also be passed to the compiler to further define the parameters, constraints, or operational modes for the conversion of the hardware description language section to an alternative programming language. In addition, the command line may call a command file containing other commands to be executed at compile time. A command file may include such things as a stoplist 122, locations of linking files 123, a leaveout list 124, or a mapto list 126.

The various embodiments of the compiler of the present invention may also be operated, or run, based upon different operational modes which simulate various clocking operations for the hardware described by the hardware description language. The availability of different operational modes allows the compiler to simulate different clock modes. For instance, some hardware designs operate using a single master clock while others hardware designs have multiple clock inputs or a single clock input which may be divided to generate one or more internal clock signals.

The compiler may be operated in a first operational mode, "mode0," where no implied clock is assumed. This is typically the default operational mode if no other mode is specified in a command line or command file. Operating in mode0, the system updates the internal state and outputs of the hardware design each time an object-oriented programming language routine is called within the program. In mode0, the generated output routines must be called sufficiently frequently so as not to alias the main (fastest) clock, or any other clocks that are fed in at the top-level. Edge detectors for the mode0 clocks generate a variable name for the previous value, known as the historic variable as already mentioned. The compiler attaches a suffix to these variables that may be controlled by a user to prevent clashes that may occur elsewhere in the user's code.

Variables in the user's source code that are reserved words in the alternative programming language, or those which might clash with variable names generated by the compiler for its various purposes, such as masters or historic variables, require renaming. By modifying a special system file, provided with the compiler, the rules for renaming can be modified by the user. The default rules in the default version of this file implement renaming by prefixing one of a number of special strings onto the start of each such user variable to effect the renaming. The defined string used depends on the context. The user can change these strings if clashes are still found to arise with their particular design. An example of the prefixing of a variable name is illustrated in Table II, where the intermediate variable is formed by appending '_t' to the variable.

Operating in a second operational mode, "mode1," a designated actual clock input signal is unused. Instead, mode1 emulates the next active edge on the designated clock signal each time the code is executed. In mode1, the command line flag accepts the name of a signal that is present in the top-level module clock input. For example, in the command line flag-mode1 clk, the clk identifier of the argument is to be treated as the clock. Without mode1 operation, an object-oriented routine would have to be called twice to simulate a changing clock signal: first with the clock set low and then with the clock set high. Using mode1, a simulation may be optimized because the programming routine is only called once to simulate a clock cycle.

In a multi-section compilation approach, certain sections may be compiled with a designated mode1 clock and others not. This information is held in a linking file that describes the results of a section compilation. When the compiler is generating calls to previously compiled sections, if a clock signal is mode0 in the calling code and mode1 in the called code, the edge detector is generated in the calling code. The reverse situation, where calling from mode1 to mode0, of the same clock, requires two calls to the called code to be generated, one with the clock net low and the other with it high.

In addition to the various operational modes, multiple compilations using the present invention may be linked together to simulate a large integrated circuit design. To handle such large compilations, or for general modular approaches to simulations, linking information is generated by the compiler at each run. The linking information allows the output from previous runs and compilations to be stitched together. Typically, this approach will only work with object-oriented programming languages such as C++ where both classes and methods can be defined.

Figure 2:
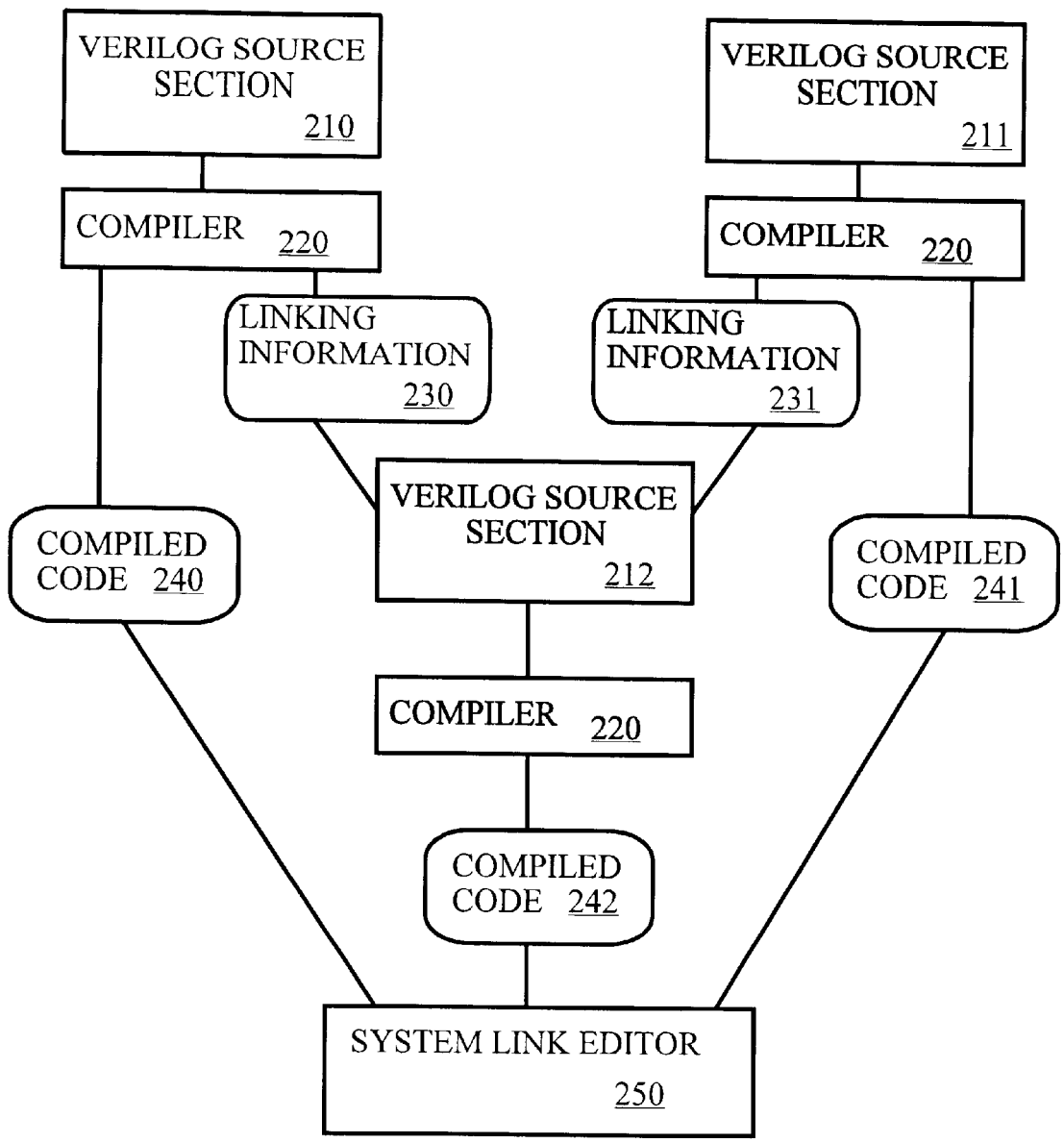
FIG. 2 illustrates a block diagram of a linked compilation using the present invention.

An example of the linking of multiple compilations of Verilog sections is illustrated in FIG. 2. Verilog sections 210, 211, and 212, are separately compiled by compiler 220 of the present invention. Compiler 220 converts the Verilog sections 210, 211, and 212 to an alternative programming language code. The alternative programming language is compiled to compiled code 240, 241, and 242, respectively, using a programming language compiler (for example, a GNU C compiler for the C programming language). The Verilog sections 210, 211, and 212, are stitched together by compiling a Verilog hierarchy where previously-compiled Verilog sections 210 and 211 are instantiated. The compiler 220 searches for linking information files 230 and 231 having the name of the instantiated Verilog section. If found, the compiler 220 generates calls to the methods of the respective methods of those Verilog sections at the appropriate points. It therefore only remains for the user to link the compiled code 240, 241, and 242 of the separately compiled Verilog sections 210, 211, and 212 using a system link editor 250. Although FIG. 2 only shows two levels of hierarchy, it is understood that there is no limit to the hierarchical depth or width at each depth.

The linking information file 230 or 231 for a Verilog section contains only a description of the ports of the root module of that section. The ports are described in the same order they appear in the source Verilog and therefore appear in the generated alternative programming language routines. For each port, the linking file 230, 231 gives its name, width, direction and sensitivity. The name is needed for instantiation representation. The sensitivity list appears for outputs and is a list of the other ports that have combinatorial routes through the section to that output. Inputs that are clock inputs for the registers whose outputs affect combinatorially that output are also listed. The width of the ports is needed for Verilog warning generation and also to show which, if any, ports have turned into more than one alternative programming language variable because they are too wide to support as one argument in the output language.

The difference between compilation of a single hardware description language section for stand-alone use and compilation for multiple section linking was earlier described with reference to the step/slave sorting 140.

A stand-alone version of the present invention may be better explained with reference to an example of the method. One embodiment of the present invention involves the conversion of a section of Verilog (a hardware description language) into an ANSI C program. This embodiment is referred to as the "C mode" hereinafter. Operating in the C mode, the compiler of the present invention reads the Verilog section and processes the Verilog section according to the method already explained.

Instructions to carry out the method of the present invention are stored as a computer program on a computer system having a central processing unit, a memory, an input device (such as a keyboard), and an output device (such as a display or printer). To execute a compilation of a Verilog section into C, the computer program is called using commands familiar to the program. A command to compile and link a Verilog section is issued which invokes the computer program, defines the Verilog section to compile and specifies a location to store the resulting C executable code. As described above, the command may include calls to command files containing additional information necessary to the compilation, such as stoplists 122, leaveout lists 124, and mapto lists 126. Furthermore, the command may designate the operational mode that is to be used to compile the Verilog section. The default operational mode, if not designated, is typically mode0.

A sample command call follows:

```
$ vtoc -o ttmyfile.c -root TEST -model clk test.v
$ gcc -Wall ttmyfile.c ttvtoclib.o testwrapper.c
$ a.out
```

The command invokes the compiler vtoc which compiles the Verilog section TEST to a C program file named ttmyfile.c. The -o command line flag designates the name of the C file to which the compiled code is written. The source file is test.v, with the v being the normal filetype for Verilog modules. The operational mode is changed from the default mode0 to mode1 by the -model clk command. Therefore, the signal called 'clk' is not used inside the generated code. The gcc (or GNU C compiler) command compiles a program in C mode and links the library file ttvtoclib.o to the C file. A hand-written C code file testwrapper.c is also included as part of the gcc command. The a.out command executes the compiled program, with its output being displayed on the console.

The following Verilog section is converted to the C code ttvmyfile.c from the above listed command call. The routines for the system variables and malfunctions contained within the C module, such as ttvtoc_ticks and ttvtoc_display, are included in the ttvtoclib.o that is called by the command gcc. The C code testwrapper.c is also included.

Verilog Section:

```
// test.v
module TEST(out, in, clk) ;
    input in, clk;
    output [3:0] out;
    reg [3:0] out;
    initial out = 0;
    always @(posedge clk) begin
        if (in) out <= out +1;
        #0 $display("Out is %h/n", out) ;
        end
endmodule
```

C Code Generated:

```
/* output from CBG TT VTOC */
#include "ttvtoc.h"
static int ttvtoc_ticks = 0; /*used for $time*/
void ttv(unsigned int*out, unsigned int*in, unsigned int*clk)
{
    ttvoc_ticks++;
    *out = (in) ? ( (*out)+1) & 15) : (*out) ;
    ttvtoc_display("Out is %h/n", *out) ;
}
/* end of tt generated C code */
```

C Code Linked as Testwrapper.c:

```
/* testwrapper.c */
#include "ttvtoc.h"
int main( )
```

```
{
    unsigned int clk, in, out;
    in = 1;
    while (1)
    {
        ttv(&out, &in, &clk) ;
        printf("Out is now %i/n", out) ;
    }
}
```

The output generated from the executing the C code generated is as follows:

Out is 0
Out is now 0
Out is 1
Out is now 1
Out is 2
Out is now 2

In addition to the C language file, the compiler generates a header file, and a report file. In the C mode, the code generated by the compiler preferably does not contain a class definition and only contains a single subroutine because C is not object-oriented and it is difficult to join together separately compiled Verilog sections using the C programming language. Thus, the C mode is ideal for compiling small chip designs where a hardware description language describes about ten thousand gates or less.

Although not all of these are illustrated in the example, the general order of components in the resulting C code created in the C mode is as follows:

Definition of variables. All variables are static char, short, int or long long int or arrays of such. All variables are declared as 'unsigned' except for those corresponding to integer declarations in the source Verilog. This is necessary to make the comparison operators work correctly, since the only signed entities in Verilog are Verilog integers.

Assignments to variable representing combinatorial nets which are used as the D-inputs to flip-flops (i.e. which occur in the right-hand side of a blocking assignment after elaboration).

Assignments to the master intermediate variables or directly to slave 'reg' variables if the dependency sorting prevented the need for a master.

Assignments from masters to slaves.

Assignments to combinatorial outputs, preceded by assignments to intermediate variables which feed into combinatorial outputs. Buffered or inverted versions of clocked variable are here regarded as combinatorial, even though buffers and inverters do not combine signals. This group is later referred to as the 'reupdate' set, and these only need be performed if external code wishes to examine the state of outputs after a clock edge.

Assignments from variable to their shadow variables for variables which are used in edge detectors.

Some of the assignments may occur more than once.

The computer program listing appendix contains code which may be used to carry out the steps of the present invention. For example, vtoc_rbocy.sml and vtoc.sml contain the entry point and main top-level routines required to invoke other parts of the compiler. The verinorm.sml file performs the rewriting of Verilog parse trees into simpler forms. A set of modules may be flattened with sflatten.sml. Behavioral elaboration is performed by the code in cv2core.sml. Sorting may be accomplished with either vtocnative.sml, which sorts using a modified bubble sort, or vtocnative.c, which is a modified bubble sort used in preferred implementations of the present invention to provide faster compile times. The vtoc_widess.sml file performs conversion of Verilog expressions and assignments to C language expressions and assignments, using the appropriate number of, and width of, each C variable for each Veriolog variable.

The invention also extends to a compiler that generates output code where there is sufficient information in the output code for the precise register widths used in the source code to be explicitly stated or automatically inferred, even though this information is not needed or used in the further compilation of the output code to machine native code. This additional information makes the output code compatible with the input format to a reciprocal compiler that converts from C to Verilog. The additional information in the Tenos output format is present in the use of C macros such as 'u3' that are defined to equal to, in this case, an unsigned char in a standard header file, but for compilation of the generated C back to Verilog, a different conditional expansion of the header file is used, that converts us macro to, for instance __builtin_reg_u(3), that is accepted by the reciprocal C to Verilog compiler.

Having thus described certain preferred embodiments of the present invention, it is to be understood that the invention defined by the appended claims is not to be limited by particular details set forth in the above description, as many apparent variations thereof are possible without departing from the spirit or scope thereof as hereinafter claimed.

COMPUTER PROGRAM LISTING APPENDIX for

**SIMULATION METHOD AND COMPILER FOR
HARDWARE/SOFTWARE PROGRAMMING**

Inventor: David J. Greaves
Docket No.: 4939US
Creation Date: 19 June 2001

Machine Format:    IBM-PC

Operating System Compatibility:    Unix WC Format (also readable with Windows text editor)
ML Programming Language List of files contained on Copy 1 and Copy 2:

| FILE NAME | FILE SIZE | CREATION DATE |
| --- | --- | --- |
| ansichdr.sml | 8KB | 06/19/2001 |
| ansicout.sml | 22KB | 06/19/2001 |
| array_scalar_nonc.sml | 4KB | 06/19/2001 |
| arrayscalar.sml | 11KB | 06/19/2001 |
| blocknets.sml | 2KB | 06/19/2001 |
| blockscan.sml | 13KB | 06/19/2001 |
| builder.sml | 15KB | 06/19/2001 |
| buzzels.sml | 2KB | 06/19/2001 |
| cbgsmllib.sml | 16KB | 06/19/2001 |
| check_condition.sml | 7KB | 06/19/2001 |
| csim4.sml | 6KB | 06/19/2001 |
| cv2.100.sml | 13KB | 06/19/2001 |
| cv2core.sml | 60KB | 06/19/2001 |
| cv2gens.sml | 37KB | 06/19/2001 |
| cverrors.sml | 3KB | 06/19/2001 |
| cvmetacmd.sml | 1KB | 06/19/2001 |
| cvmlinit.sml | 2KB | 06/19/2001 |
| cwords.sml | 2KB | 06/19/2001 |
| cxverhdr.sml | 19KB | 06/19/2001 |

| FILE NAME | FILE SIZE | CREATION DATE |
|---|---|---|
| genpadring.sml | 3KB | 06/19/2001 |
| mapping_report.sml | 1KB | 06/19/2001 |
| maths.sml | 7KB | 06/19/2001 |
| notinuse.sml | 25KB | 06/19/2001 |
| pandex.sml | 27KB | 06/19/2001 |
| rendervnl.sml | 26KB | 06/19/2001 |
| sflatten.sml | 30KB | 06/19/2001 |
| sfmapping.sml | 1KB | 06/19/2001 |
| smlnj.sml | 7KB | 06/19/2001 |
| smlnj_first.sml | 1KB | 06/19/2001 |
| tableprinter.sml | 5KB | 06/19/2001 |
| topsoaks.sml | 3KB | 06/19/2001 |
| verinorm.sml | 114KB | 06/19/2001 |
| veroptions.sml | 2KB | 06/19/2001 |
| verxcheck.sml | 17KB | 06/19/2001 |
| vnlaudit.sml | 2KB | 06/19/2001 |
| vtoc.sml | 18KB | 06/19/2001 |
| vtoc_rbody.sml | 77KB | 06/19/2001 |
| vtoc_rexpr.sml | 16KB | 06/19/2001 |
| vtoc_sort.sml | 20KB | 06/19/2001 |
| vtoc_syscexpr.sml | 3KB | 06/19/2001 |
| vtoc_widees.sml | 102KB | 06/19/2001 |
| vtocnative.c | 4KB | 06/19/2001 |
| vtocnative.sml | 2KB | 06/19/2001 |

It may be helpful to indicate the specific functions of the following main files:

verinorm.sml performs rewriting of the Verilog parse tree into simpler forms sflatten.sml performs flattening of a set of modules into one flattened module cv2core.sml performs behavioural elaboration of the parse tree into an unordered set of assignments vtocnative.sml performs sorting using the modified bubble sort vtocnative.c is the version of modified bubble sort used in a preferred implementation, where the recoding in C provides faster compile time than the sml version.

vtoc_widess.sml performs conversion of Verilog expressions and assignments into C language expressions and assignments, using the appropriate number of and width of each C variable for each Verilog variable.

vtoc_rbody.sml and vtoc.sml contain the entry point and main top-level routines required to invoke other parts of the compiler.

Respectfully,

Laurence B. Bond
Registration No. 30,549
TRASKBRITT, P.C.
P.O. Box 2550
Salt Lake City, Utah 84110
(801) 532-1922

Dated: June 21, 2001

What is claimed is:

1. A method for simulating the operation of an integrated circuit, comprising:

accessing a section of hardware description language which describes the operations of the integrated circuit, said section of hardware description language comprising at least one module;

determining which at least one module of said section of hardware description language to include in a simulation;

flattening each of said at least one modules determined to be included in said simulation into a single module;

compiling said single module to an unordered list of assignments;

sorting said unordered list of assignments into sorted sequential groups and sorted combinatorial groups of assignments; and compiling said sorted sequential groups and said sorted combinatorial groups into a alternative programming language.

2. The method of claim 1, wherein said accessing a section of hardware description language comprises reading a section of hardware description language into a computer operating an integrated circuit chip simulation.

3. The method of claim 1, wherein said determining which at least one module of said section of hardware description language to include in a simulation comprises accessing a stoplist to retrieve a list of compiled modules to substitute in place of said at least one module of said section of hardware description language.

4. The method of claim 3, wherein said stoplist includes names of said at least one module of said section of hardware description language and a call to a linking list for providing a routine to substitute for each respective name on said stoplist.

5. The method of claim 1, wherein said determining which at least one module of said section of hardware description language to include in a simulation comprises accessing a leaveout list to determine if any of said at least one modules should be ignored in said simulation.

6. The method of claim 1, wherein said determining which at least one module of said section of hardware description language to include in a simulation comprises accessing a mopto list to retrieve object-oriented programming language routines to substitute for tasks and functions defined in said at least one module of said section of hardware description language.

7. The method of claim 1, wherein said compiling said single module to an unordered list of assignments is accomplished using behavioral elaboration.

8. The method of claim 1, wherein said alternative programming language is ANSI C, C++, or Java.

9. A method for converting a hardware description language to an alternative programming language, comprising:

reading a section of a hardware description language describing a portion of a chip design; and generating an alternative programming language subroutine from the section of hardware description language read for modeling the behavior of the hardware description language;

wherein said generating an alternative programming language subroutine comprises:

flattening said read section of hardware description language;

forming a set of unordered pairs of assignments using behavioral elaboration;

sorting said set of unordered pairs into an ordered set of sequential assignments and an ordered set of combinatorial assignments; and converting said sets of unordered pairs into an alternative programming language.

10. The method of claim 9, wherein said hardware description language is Verilog or VHDL.

11. The method of claim 9, wherein said alternative programming language is C, C++, or Java.

12. The method of claim 9, wherein reading a section of hardware description language comprises reading at least a portion of a chip design described by at least one module of hardware description language.

13. A method for converting Verilog into C or C++ using a compiler, comprising:

reading a Verilog section with said compiler;

flattening said Verilog section into a single module;

converting said module into a set of pairs of unordered assignments;

sorting said set of pairs of unordered assignments into ordered sequential groups of assignments and ordered combinatorial groups of assignments; and converting said ordered sequential groups of assignments and ordered combinatorial groups of assignments into a C or C++ programming language.

14. The method of claim 13, wherein said flattening said Verilog section into a single module comprises:

obtaining a list of modules of said Verilog section from a stoplist;

obtaining a list of linking files for said stoplist wherein a linked file is associated with each module on said stoplist;

flattening the modules from said Verilog section that are not on said stoplist; and inserting said associated linked file into said flattened modules for each module in said stoplist.

15. The method of claim 13, wherein said flattening said Verilog section into a single module comprises:

obtaining a list of modules of said Verilog section from a leaveout list; and flattening the modules from said Verilog section that are not on said leaveout list.

16. The method of claim 13, wherein said flattening said Verilog section into a single module comprises:

obtaining a list of tasks and functions of said Verilog section from a mapto list;

obtaining a list of linking files for said mapto list wherein a linked file is associated with each task or function on said mapto list;

flattening said Verilog section except for said tasks and functions appearing on said mapto list; and inserting said associated linked file into said flattened Verilog section for each task or function on said mapto list.

* * * * *